(12) United States Patent
Maekawa et al.

(10) Patent No.: US 8,727,757 B2
(45) Date of Patent: May 20, 2014

(54) MOLDING DIE SET AND RESIN MOLDING APPARATUS HAVING THE SAME

(75) Inventors: Masanori Maekawa, Chikuma (JP); Tomokazu Takahashi, Chikuma (JP)

(73) Assignee: Apic Yamada Corporation, Nagano (JP)

( * ) Notice: Subject to any disclaimer, the term of this patent is extended or adjusted under 35 U.S.C. 154(b) by 177 days.

(21) Appl. No.: 13/361,782

(22) Filed: Jan. 30, 2012

(65) Prior Publication Data
US 2013/0028998 A1 Jan. 31, 2013

(30) Foreign Application Priority Data

Jul. 29, 2011 (JP) ................................ 2011-166251

(51) Int. Cl.
*B29C 45/14* (2006.01)
*H01L 21/56* (2006.01)

(52) U.S. Cl.
USPC .......... 425/89; 249/155; 425/125; 425/129.1; 425/218

(58) Field of Classification Search
USPC .............. 425/89, 125, 129.1, 218; 249/155
See application file for complete search history.

(56) References Cited

U.S. PATENT DOCUMENTS

| | | | | |
|---|---|---|---|---|
| 5,326,243 A | * | 7/1994 | Fierkens | 425/116 |
| 5,344,600 A | * | 9/1994 | McShane et al. | 264/219 |
| 5,766,650 A | * | 6/1998 | Peters et al. | 425/116 |
| 5,989,471 A | * | 11/1999 | Lian et al. | 264/271.1 |
| 6,196,821 B1 | * | 3/2001 | Chen | 425/125 |
| 6,478,562 B1 | * | 11/2002 | Miyajima | 425/89 |
| 7,829,004 B2 | * | 11/2010 | Ho et al. | 264/272.15 |
| 7,901,196 B2 | * | 3/2011 | Narasimalu et al. | 425/116 |
| 2002/0015748 A1 | * | 2/2002 | Miyajima et al. | 425/89 |
| 2005/0106786 A1 | * | 5/2005 | Kuratomi et al. | 438/127 |

FOREIGN PATENT DOCUMENTS

| | | | |
|---|---|---|---|
| JP | 2004259761 A | * | 9/2004 |
| JP | 2006319226 A | * | 11/2006 |
| JP | 2009-190400 A | | 8/2009 |

OTHER PUBLICATIONS

Partial machine translation of JP 2004259761A dated Sep. 2004 obtained from the JPO website.*
Partial machine translation of JP 2006319226A dated Nov. 2006 obtained from the JPO website.*

* cited by examiner

*Primary Examiner* — Robert B Davis
(74) *Attorney, Agent, or Firm* — Birch, Stewart, Kolasch & Birch, LLP

(57) ABSTRACT

The molding die set includes: a first molding die having a first molding chase, a cavity piece, supported by the first molding chase, movably supported by the first molding chase and enclosing the cavity piece; a second molding die having a second molding chase, a work supporting section biased and supported by the second molding chase and on which a work will be mounted, and a center insert located adjacent to the work supporting section; and a pot being provided to one of the first molding die and the second molding die, the pot feeding resin for molding the work. The second molding die has a thickness adjusting mechanism, which makes the work supporting section absorb thickness variation of the work and brings the work into contact with the movable clamper when the work is clamped with the movable clamper of the first molding die.

11 Claims, 8 Drawing Sheets

MOLDING DIE SET AND RESIN MOLDING APPARATUS HAVING THE SAME

CROSS-REFERENCE TO RELATED APPLICATION

This application is based upon and claims the benefit of priority of the prior Japanese Patent Application No. P2011-166251, filed on Jul. 29, 2011 and the entire contents of which are incorporated herein by reference.

FIELD

The present invention relates to a molding die set, which clamps and resin-molds a work, and a resin molding apparatus having the molding die set.

BACKGROUND

The applicant of the present application has invented transfer molding apparatuses capable of mass-producing thin semiconductor devices, whose thin package sections can be resin-molded with a designed thickness and without forming unfilled parts.

In one of the conventional transfer molding apparatuses, a work set in a molding die set is clamped, by a clamper, in a state where a cavity piece is upwardly moved a prescribed distance, which is greater than a designed thickness of a molded product, to an evacuating position and held at the evacuating position, and then a plunger is actuated, in a state where the clamper clamps the work, with maintaining a first resin pressure so as to fill a cavity-concave section with molten resin. After filling the resin, the cavity piece is downwardly moved into the cavity-concave section until reaching a molding position corresponding to the designed thickness of the molded product so as to flow surplus resin from the cavity-concave section toward the pot via a gate, so that an amount of the resin can be adjusted to that for producing the molded product having the designed thickness. Further, the plunger is actuated again so as to maintain a second resin pressure, which is higher than the first resin pressure, to thermally cure the resin (see Japanese Laid-open Patent Publication No. P2009-190400A).

SUMMARY

However, in the molding die set disclosed in Japanese Laid-open Patent Publication No. P2009-190400A, the work (e.g., substrate) is clamped between an upper molding die, in which an upper die insert is movable, and a lower molding die, which has a rigid structure. In case of molding the work whose thickness variation is small (e.g., single layer substrate), no problems occur. However, in case of molding the work whose thickness is widely varied (e.g., multilayer substrate), clamping force of the clamper applied to the work is varied, so resin flashes will be formed and quality of the molded product will be lowered. The thickness of the resin-molded part will be badly influenced by a thickness of the work, so it is difficult to resin-mold the works with uniform thickness.

Accordingly, it is objects to provide a molding die set and a resin molding apparatus capable of solving the above described problems of the above described conventional technology. Namely, even in case of molding a thick work, the molding die set of the present invention is capable of clamping a work with balance and mass-producing high quality thin molded products with no resin flashes. The resin molding apparatus of the present invention has the molding die set.

To achieve the object, the present invention has following structures.

Namely, the molding die set of the present invention comprises:

a first molding die having a first molding chase, a cavity piece, which is supported by the first molding chase and which constitutes a bottom part of a cavity, and a movable clamper, which is movably supported by the first molding chase and which encloses the cavity piece so as to form a cavity-concave section;

a second molding die having a second molding chase, a work supporting section, which is biased and supported by the second molding chase and on which a work will be mounted, and a center insert, which is located adjacent to the work supporting section; and a pot being provided to one of the first molding die and the second molding die, the pot feeding resin for molding the work, and the second molding die further has a thickness adjusting mechanism, which makes the work supporting section absorb thickness variation of the work and brings the work into contact with the movable clamper when the work supported by the work supporting section is clamped with the movable clamper of the first molding die.

With this structure, the thickness adjusting mechanism makes the work supporting section absorb the thickness variation of the work and brings the work into contact with the movable clamper, so that a thickness of resin-molding is not influenced by the thickness of the work. Even in case of molding works whose thicknesses are widely varied, the works can be resin-molded with uniform thickness.

Preferably, the cavity piece is fixed to the first molding chase, and the movable clamper enclosing the cavity piece is held by a first elastic member.

With this structure, a clearance above the work can be precisely controlled, by displacement of the second molding die, without changing the height of the cavity piece forming the bottom part of the cavity, so that the thickness of resin-molding can be precisely controlled.

Preferably, the movable clamper is held by a first elastic member, whose elastic power is greater than that of a second elastic member of the thickness adjusting mechanism which biases the work supporting section.

With this structure, when the work is clamped by the first molding die and the second molding die, the second elastic member is bent according to the thickness of the work, without bending the first elastic member holding the movable clamper, so that the work can be clamped at constant height without reference to the thickness of the work.

Further, clamping force from the movable clamper can be continuously applied to the work, so that forming resin flashes can be prevented.

Preferably, a wedge mechanism, which supports and fixes the work supporting section at a prescribed height, is provided between the work supporting section and the second molding chase.

With this structure, even if the work supporting section is pressed downward by the movable clamper, the wedge mechanism fixes the work supporting section at the prescribed height, so that the work supporting section is not excessively moved downward by the movable clamper and the thickness of resin-molding can be maintained.

In the molding die set, the cavity-concave section and the thickness adjusting mechanism may be provided on each side of the center insert.

With this structure, even if thicknesses of the works are different, upper faces of the works can be leveled with each other, so that thicknesses of resin-molding of the products can be equalized and forming resin flashes can be prevented.

In the molding die set, a cavity piece adjusting mechanism, which adjusts a height of the cavity piece, may be provided to the first molding die.

With this structure, the thickness of resin-molding can be adjusted by moving the cavity piece. The cavity piece adjusting mechanism is capable of rigidly set the height of the cavity piece and the height of the cavity piece can be precisely set, so that the thickness of resin-molding can be precisely controlled.

In the molding die set, a clamper may be fixed to the first molding chase of the first molding die, and a wedge mechanism, in which a wedge block is moved and brought into contact with the cavity piece, by a driving source, so as to adjust a height of the cavity piece, may be provided to the first molding die.

With this structure, the cavity piece is moved downward and upward by the wedge block, so that the cavity piece can be easily moved downward and upward. Further, the thickness of resin-molding can be precisely controlled with precisely maintaining the height of the cavity piece.

Preferably, a release film is provided on a die face of the first molding die, which includes the cavity-concave section.

With this structure, invading the resin into a gap between the movable damper and the cavity piece can be prevented, so that the thickness of resin-molding can be easily controlled and number of maintenance for removing resin contaminations can be reduced.

Preferably, the movable clamper clamps the work and relatively separates the cavity piece from a clamping face of the movable clamper until a relative position of the cavity piece, with respect to the clamping face, reaches an evacuating position, at which the cavity piece is separated a prescribed distance, which is greater than a designed thickness of a molded product, from the clamping face, the molten resin in the pot is pressurized and fed to the cavity so as to fill the cavity, and the clamping action is further performed to relatively move the cavity piece, toward the clamping face of the movable clamper, until reaching a prescribed shallow position so as to drain surplus resin toward the pot and thermally cure the same.

With this structure, even in case that the thickness of resin-molding is thin, the cavity can be fully filled with the molten resin and the surplus resin can be drained by clamping the cavity piece until reaching the prescribed shallow position, so that quality of the molded product can be improved.

Further, the surplus resin drained into the pot can be stored by, for example, moving a plunger of the pot downward, so that no special mechanism for storing the surplus resin is required. Therefore, the structure of the molding die set can be simplified.

In the molding die set, a movable piston may be provided in a cull section, which faces the pot and capable of moving close to and away from a clamping face, and the movable piston may be moved away from the clamping face so as to store surplus resin.

With this structure, the surplus resin drained into the pot can be stored by moving the movable piston away from the clamping face, so that an amount of the surplus resin drained into the pot can be reduced and a cull of the molded product can be easily removed from the molding die.

In the molding die set, an overflow cavity may be formed in a clamping face of the movable clamper, and surplus resin overflowed from the cavity-concave section may be stored in the overflow cavity.

With this structure, the overflow cavity is formed in the clamping face of the movable clamper, in which an air vent is formed, and the surplus resin is stored in the overflow cavity, so that an amount of the surplus resin drained into the pot can be reduced and the cull of the molded product can be thinner. Therefore, time to perform the molding action can be shortened.

The resin molding apparatus of the present invention has any one of the above described molding die sets. Therefore, the resin molding apparatus is capable of absorbing variation of the thickness of the work and improving quality of the molded product.

In the molding die set of the present invention, even in case of molding the thick work, the work can be clamped with balance, and high quality thin products, e.g., thin packages, can be mass-produced with no resin flashes.

Further, the resin molding apparatus of the present invention has the molding die set, so that quality of the resin-molded product can be improved.

BRIEF DESCRIPTION OF THE DRAWINGS

Embodiments of the present invention will now be described by way of examples and with reference to the accompanying drawings, in which.

DETAILED DESCRIPTION OF THE EMBODIMENTS

Figure 1A:
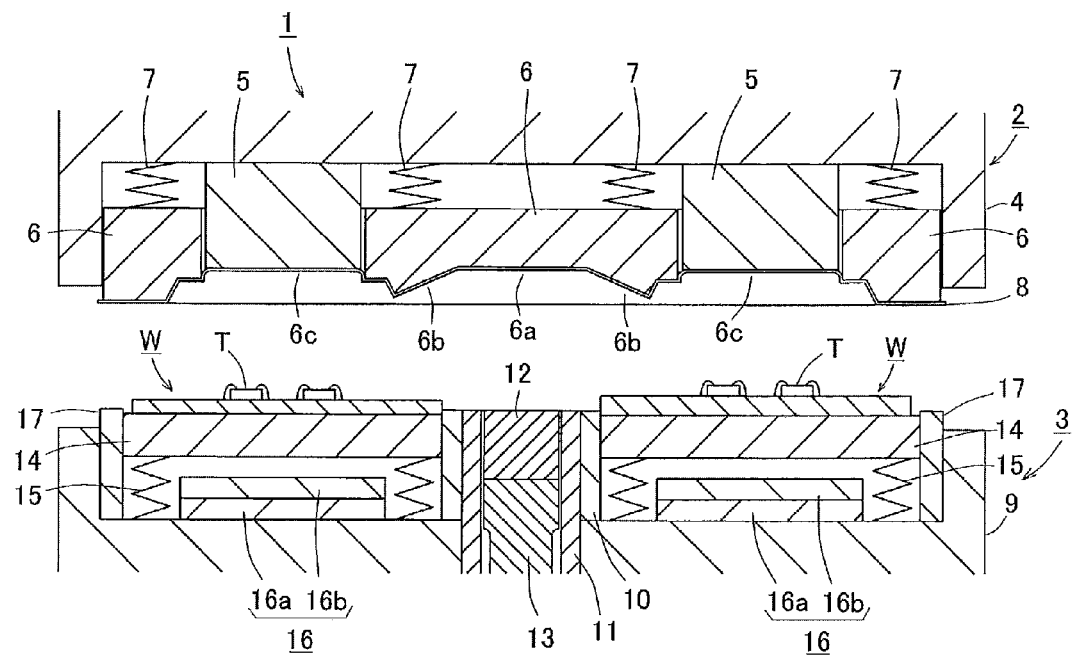
FIGS. 1A and 1B are sectional views of a molding die set of Embodiment 1, which show a molding action.

Preferred embodiments of the present invention will now be described in detail with reference to the accompanying drawings. In each of the following embodiments, a transfer molding apparatus will be explained. The transfer molding apparatus has a molding die set comprising: an upper molding die including cavity-concave sections; and a lower molding die including pots. Note that, the lower molding die is a movable molding die, and the upper molding die is a fixed molding die.

Embodiment 1

Firstly, a schematic structure of the transfer molding apparatus will be explained with reference to FIG. 1. The molding die set 1 is constituted by an upper molding die 2 and a lower molding die 3.

The upper molding die 2 will be explained. In the upper molding die 2, cavity pieces 5 which form bottom parts of cavities are fixed to an upper chase block 4. With this structure, heights of the cavity pieces 5, which form the bottom parts of the cavities, are not varied, so clearances above works W can be precisely varied by vertically moving the lower molding die 3 only. Therefore, thickness of resin-molding can be precisely controlled. In the present embodiment, the cavity pieces 5 may be positioned, in the upper chase block 4, with other blocks which rigidly support the cavity pieces 5. A planar size of each of the cavity pieces 5 is larger than that of a mounting area of each of the work W, in which wire-bonded semiconductor chips T are arranged in a matrix form. Therefore, the molding die set 1 is capable of performing map-type molding, in which pluralities of the semiconductor chips T can be molded at one time. Package parts of the semiconductor chips T, which have been map-type-molded at one time, are respectively cut and separated by, for example, a known dicer, so that separated semiconductor devices can be produced. Note that, in case of some large packages (e.g., in-car package), the work W on which pluralities of the semiconductor chips T are mounted is molded, at one time, as one product, and the product is not cut and separated.

Movable clamper 6 for clamping the works W is provided to enclose the cavity pieces 5. The movable clamper 6 is respectively suspended by first springs 7. Pluralities of through-holes are formed in the movable clamper 6. The cavity pieces 5 are inserted into each the through-holes. In a clamping face of the central movable clamper 6, an upper cull section 6a and upper runner gates 6b are formed. Cavity-concave sections 6c are formed by the cavity pieces 5 and the movable clamper 6 enclosing the cavity pieces 5.

A release film 8 is set on a clamping face of the upper molding die 2 including the cavity-concave sections 6c. The release film 8 is sucked and held, on the clamping face of the upper molding die 2, by a known sucking mechanism, in which gaps between the cavity pieces 5 and the movable clamper 6 are used to suck air. The release film 8 is capable of heat-resisting temperature of the heated molding die set 1 and has enough flexibility and extensibility. The suitable release film 8 is composed of, for example, PTFE, ETFE, PET, FEP, glass cloth including fluorine, polypropylene, polyvinylidene chloride. The release film 8 is a long film wound on a feeding roll (not shown). A front end of the release film 8 is extended from the feeding roll to cover the clamping face of the upper molding die 2 and wound on a collecting roll (not shown). By using the release film 8, ejector pins can be omitted from the molding die set 1. Leakage of resin through the gaps between the cavity pieces 5 and the movable clamper 6 can be prevented. Therefore, high processing accuracy is not required, so that the molding die set 1 can be produced at low cost.

Next, the lower molding die 3 will be explained. A lower movable platen (not shown), on which a lower chase block 9 is mounted, is moved upward and downward, by a known die driving mechanism (e.g., toggle link or screw driven by an electric motor), so that the lower molding die 3 can be moved upward and downward for closing and opening the molding die set 1. A speed of the up-down movement of the lower molding die 3 and pressing force can be optionally set. Further, when surplus resin is returned via gates, a flowing speed and a pressure of molten resin can be optionally set. Therefore, the speed of the up-down movement, the pressing force, the flowing speed and the pressure of the resin can be controlled by the die driving mechanism, so that the structure of the molding apparatus can be simplified.

A lower die center insert 10 is attached in the lower chase block 9. Cylindrical pots 11, in each of which resin for molding (e.g., resin tablet 12) is set, are attached in the lower die center insert 10 along the longitudinal center line. An upper end of the lower die center insert 10 is leveled with or slightly higher than that of the pots 11. A plunger 13, which is moved upward and downward by a known transfer driving mechanism, is provided in each of the pots 11. In the present embodiment, pluralities of the plungers 13 are respectively provided in pluralities of the pots 11. The plungers 13 are supported by a supporting block (not shown). An elastic member (not shown) is provided to a supporting section of each of the plungers 13. By the elastic member, each of the plungers 13 can be slightly displaced, so that excessive pressing force can be relieved. Further, each of the plungers 13 is capable of adapting to variation of amount of the resin tablet 12 while keeping resin pressure.

Work supporting sections 14 are provided on the lower chase block 9, and they are respectively located on the both sides of the lower die center insert 10. In each of the works W, the semiconductor chips T are mounted on one side surface (e.g., upper surface), and the one side surface will be resin-molded. The work supporting sections 14 are floating-supported by second springs 15, which are provided between an upper face of the lower chase block 9 and bottom faces of the work supporting sections 14. Note that, spring force of the first springs 7, which suspend the movable clamper 6, is greater than that of the second springs 15. For example, the spring force of the first springs 7 applied to the works W and the work supporting sections 14 is fully greater than the spring force of the second springs 15 applied thereto. Therefore, the second springs 15 can be compressed, without compressing the first springs 7 by moving the lower molding die 3 upward when the molding die set 1 is closed, so that the works W can be clamped at a constant height, without reference to thicknesses of the works W, when the works W are clamped. Further, clamping force of the movable clamper 6 can be continuously applied to the works W, and forming resin flashes can be prevented.

Thickness adjusting blocks 16a and 16b, which are vertically stacked and whose boundary faces are formed into slant faces, are provided between the lower chase block 9 and each of the work supporting sections 14, which is supported by the second springs 15. The thickness adjusting blocks 16a and 16b are extended in the direction perpendicular to the paper surface of the drawing. Therefore, a total thickness of the thickness adjusting blocks 16a and 16b is constant in the extending direction. One of the thickness adjusting blocks 16a and 16b, which are vertically stacked, can be slid, on the other, by a suitable driving unit (not shown), e.g., air cylinder unit, electric motor. Each pair of the thickness adjusting blocks 16a and 16b constitute a wedge mechanism (thickness adjusting mechanism) 16.

The total thickness of the wedge-shaped thickness adjusting blocks 16a and 16b can be varied by sliding one of the thickness adjusting blocks 16a and 16b, and positions of the thickness adjusting blocks 16a and 16b can be fixed by frictional force between the boundary faces thereof, so no resin pressure is applied to the driving unit. Therefore, in comparison with a conventional mechanism in which positions of work supporting sections are fixed by a braking mechanism actuated by a known actuator, the positions of the work supporting sections 14 can be highly precisely maintained. Note that, the thickness adjusting mechanism is not limited to the wedge mechanism 16. For example, the positions of the work supporting sections 14 may be adjusted by a mechanism including elastic members, which correspond to the second springs 15, and a suitable driving source (e.g., air cylinder unit, hydraulic cylinder unit, servo motor). Further, step-like thickness adjusting blocks may be engaged with each other so as to adjust the total thickness of the thickness adjusting blocks.

By employing the wedge mechanism 16, even if the movable clamper 6 presses the work supporting sections 14 downward by moving the lower molding die 3 upward, the work supporting sections 14 can be fixed and maintained, at the prescribed height, by the wedge mechanism 16, so that the work supporting sections 14 are not excessively moved downward by the movable clamper 6 and the thicknesses of resin-molding can be maintained.

Note that, the upper thickness adjusting blocks 16a may be integrated with lower parts of the work supporting sections 14. In this case, the lower thickness adjusting blocks 16b are slid by the driving unit.

Clamper supporting sections 17 are respectively located adjacent to and on the outer side of the work supporting sections 14. The clamper supporting sections 17 are provided on the lower chase block 9. Upper end faces of the clamper supporting sections 17 are leveled with an upper end face of the lower die center insert 10.

When the movable clamper 6 clamping the works W moves the work supporting sections 14 downward against the spring force of the second springs 15, a clamping face of the movable clamper 6 contacts the upper end faces of the clamper supporting sections 17.

The resin molding action of the transfer molding apparatus will be explained with reference to FIGS. 1A-3.

FIG. 1A shows a state where the molding die set 1 is opened.

The release film 8 is sucked and fixed on the clamping face of the upper molding die 2. The works W are respectively set on the work supporting sections 14, which are located on the both sides of the lower die center insert 10, and the resin tablets 12 are respectively set in the pots 11. The upper ends of the work supporting sections 14 are slightly lower than the upper end of the lower die center insert 10 and the clamper supporting sections 17, which enclose the work supporting sections 14. When the works W are set, the works W are pushed toward the lower die center insert 10. Upper faces of the works W on the work supporting sections 14 are slightly higher than the upper ends of the lower die center insert 10 and the clamper supporting sections 17.

Figure 1B:
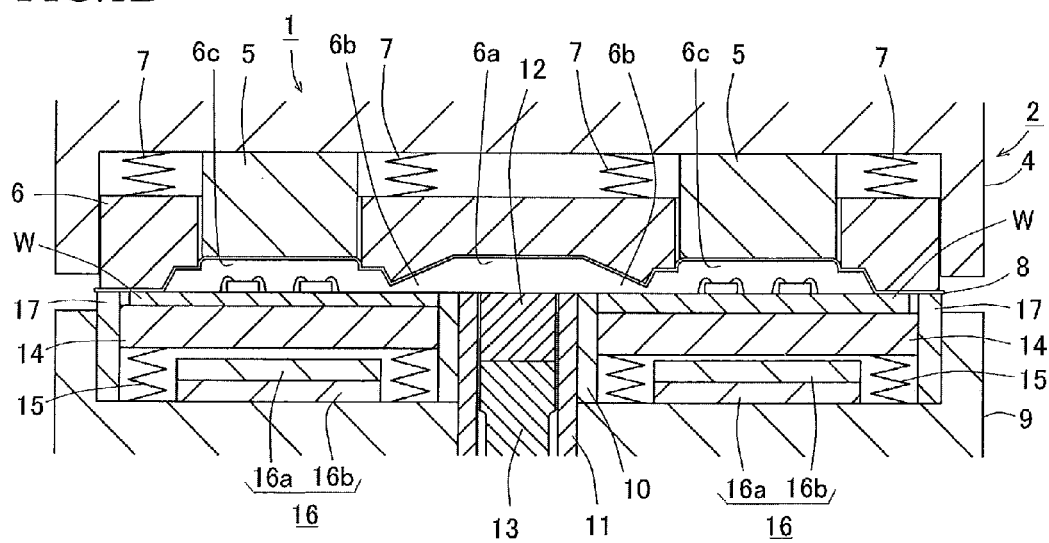

In FIG. 1B, the lower molding die 3 is moved upward, the movable clamper 6 clamps the upper faces of the works W and press the work supporting sections 14 downward, and the movable clamper 6 contacts the clamper supporting sections 17. In this clamping state, thickness differences of the works W are absorbed, so that the upper faces of the works W, the upper end of the lower die center insert 10 and the upper ends of the clamper supporting sections 17 are leveled with each other. As shown in FIG. 1B, even if the thicknesses of the works W located on the both sides of the lower die center insert 10 are different, the upper faces of the works W can be leveled with each other and the works W can be resin-molded, without forming resin flashes, with uniform resin thickness. Note that, gaps may be formed between the upper thickness adjusting blocks 16a of the wedge mechanism 16 and the work supporting sections 14.

Figure 2A:
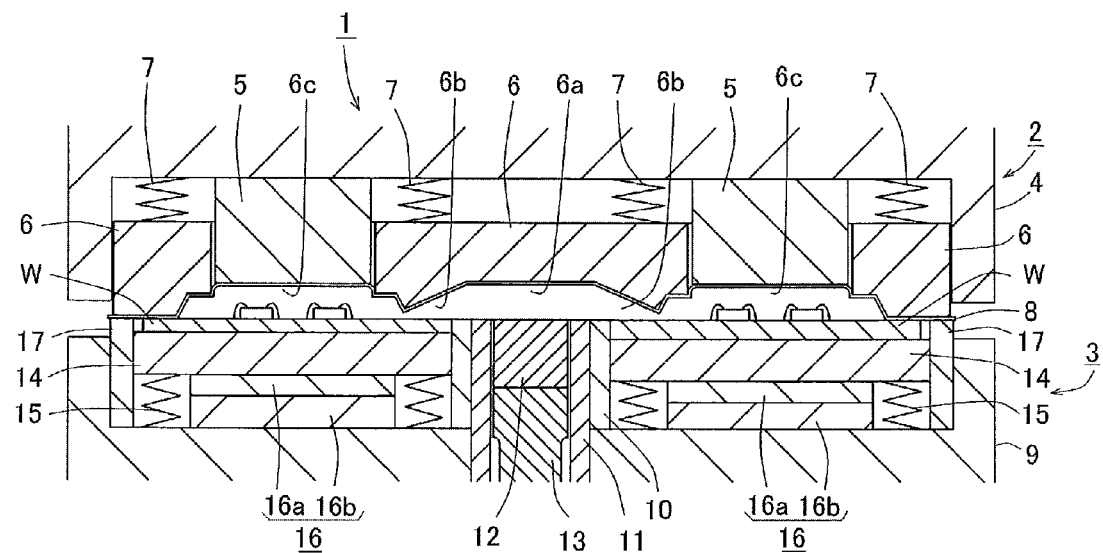
FIGS. 2A and 2B are sectional views of the molding die set of Embodiment 1, which show the molding action.

Next, in FIG. 2A, the movable clamper 6 is pressed onto the works W with adjusting the heights of the work supporting sections 14 supporting the works W and absorbing the thickness differences of the works W. For example, the lower thickness adjusting blocks 16b are moved, a prescribed distance, forward or backward, by the driving unit (not shown), e.g., air cylinder unit, so as to make the upper thickness adjusting blocks 16a tightly contact the bottom faces of the work supporting sections 14.

In this action, the movable clamper 6 clamps the works W and relatively separates the cavity pieces 5 from the clamping face of the movable clamper 6 until relative positions of the cavity pieces 5, with respect to the clamping face, reach evacuating positions, at which the cavity pieces 5 are separated a prescribed distance, which is greater than a designed thickness of the molded product, from the clamping face.

Figure 2B:
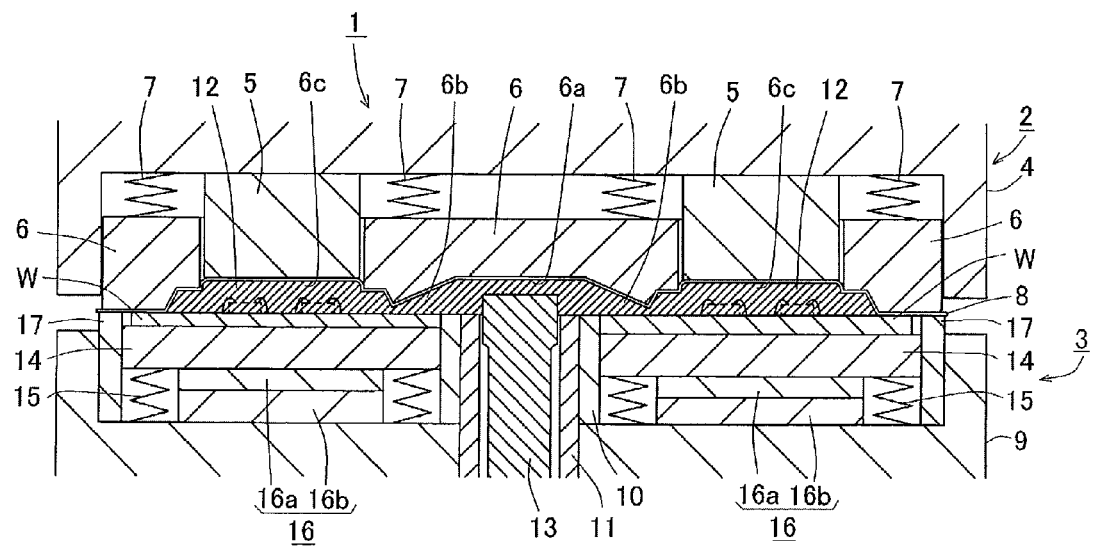

Next, as shown in FIG. 2B, the plungers 13 are moved upward, in the state where the movable clamper 6 clamps the works W, so as to supply the resin 12, which has been melted in the pots 11, to the cavity-concave sections 6c, via the upper cull sections 6a and the upper runner gates 6b, until filling the cavity-concave sections 6c. Clearances above the semiconductor chips T on the works W are large, so a speed of the molten resin is reduced. Namely, the cavity-concave sections 6c are filled with the molten resin at a low speed and at a low pressure. Therefore, wire-flow, which will be caused by filling cavity-concave sections with molten resin at high speed, can be prevented, so that high quality products can be produced.

Figure 3:
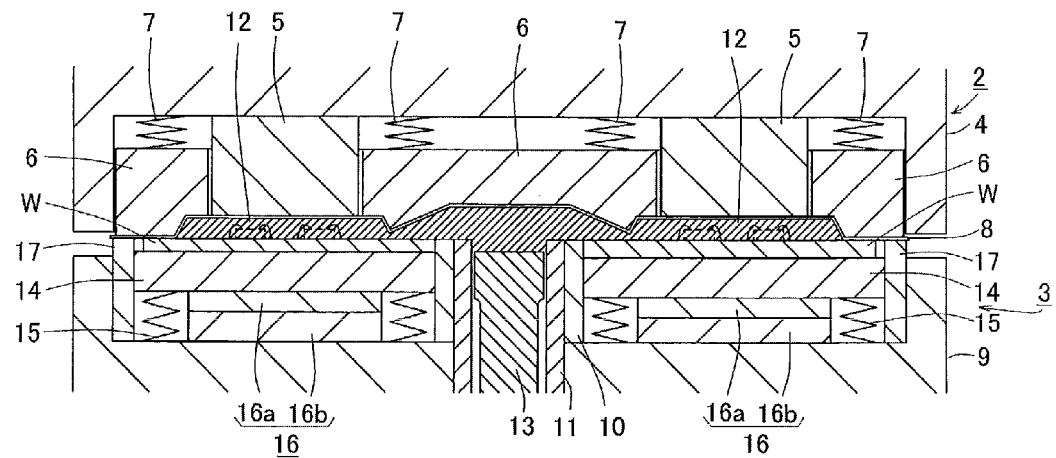
FIG. 3 is a sectional view of the molding die set of Embodiment 1, which show the molding action.

After filling the cavity-concave sections 6c with the molten resin 12, the lower molding die 3 is further moved upward to advance the clamping action, as shown in FIG. 3. Then, the movable clamper 6 compresses the first springs 7, with the lower die center insert 10 and the clamper supporting sections 17, and surplus resin is pressurized and returned from the cavity-concave sections 6c toward the pots 11 via the gates, so that the relative positions of the cavity pieces 5 with respect to the movable clamper 6 reach molding positions, which correspond to the designed thickness of the molded products. In this action, the work supporting sections 14 have been brought into contact with the upper thickness adjusting blocks 16a of the wedge mechanism 16. Therefore, even if the resin pressure is increased, the work supporting sections 14 are never moved downward. The surplus resin returned toward the pots 11 are collected and stored by moving the plungers 13 downward.

The first springs 7 are compressed by the lower die center insert 10 and the clamper supporting sections 17. Therefore, in comparison with a structure in which the first springs 7 are compressed, by the works W, without using the clamper supporting sections 17, no excessive clamping force is applied to the works W in the molding action of the present embodiment, so that breaking or damaging the works W can be prevented while the molding action.

Concretely, clearances between the cavity pieces 5 and the upper face of the semiconductor chips T are in proportion to the height of the lower molding die 3. When the lower molding die 3 is moved upward until the thickness of resin-molding reaches the designed thickness, amount of compressing the first springs 7 is increased and pressing force is also increased. Since the pressing force of the first springs 7 is varied by the thickness of resin-molding, thin and weak works (e.g., thin substrate) will be broken or damaged. In the present embodiment, the pressing force of the first springs 7 is received by the clamper supporting sections 17 instead of the works W, so that breaking and damaging the works W can be securely prevented when the surplus resin is pressurized to return via the gates. Therefore, even if the pressing force is increased to securely fill the cavities, breaking or damaging the works W can be securely prevented.

To maintain the resin pressure in the cavities, the molten metal is thermally cured with moving the plungers 13 upward again if required.

By the above described resin-molding action, the works W can be resin-molded, with uniform thickness, without being influenced by thickness variations of the works W. In case that the thickness of the resin-molding is thin, the cavities can be smoothly filled with the molten resin, and the surplus resin can be drained, by clamping the cavity pieces 5, until the thickness of resin-molding reaches the designed thickness, after filling the cavities, so that quality of the molded products can be improved.

The surplus resin drained toward the pots 11 can be stored by moving the plungers 13 downward. Therefore, no special unit for storing the surplus resin is required, so that the structure of the molding die set 1 can be simplified.

Embodiment 2

Next, Embodiment 2 of the molding die set will be explained. The structural elements described in Embodiment 1 are assigned the same symbols and explanation will be omitted.

Figure 4A:
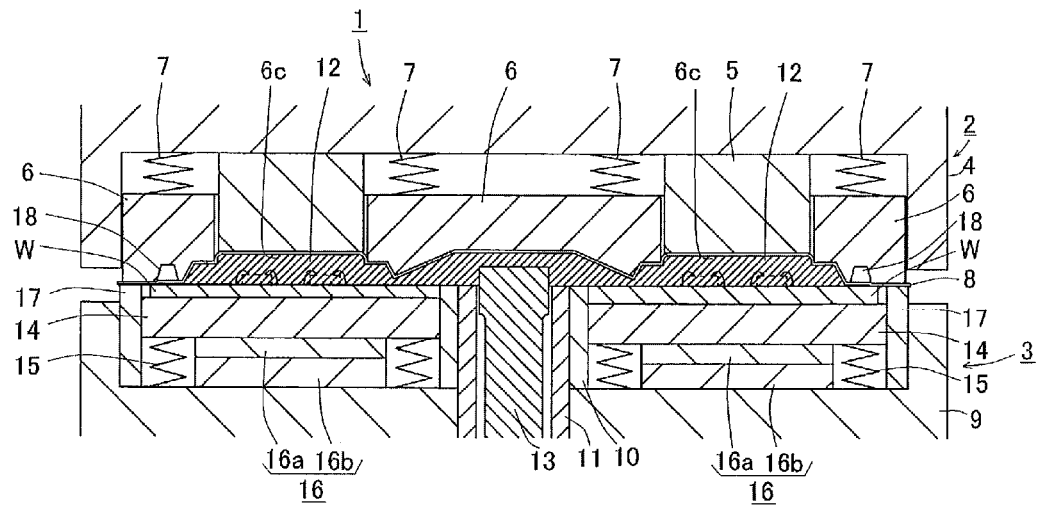
FIGS. 4A and 4B are sectional views of a molding die set of Embodiment 2, which show a molding action.

As shown in FIG. 4A, overflow cavities 18 are respectively formed in the clamping face of the movable clamper 6. Note that, the work clamping actions, shown in FIGS. 1A-2A, are also performed in the present embodiment, so explanation will be omitted.

As shown in FIG. 4A, the plungers 13 are moved upward, in a state where the movable clamper 6 clamps the works W, so as to fill the cavity-concave sections 6c with the molten resin, which has been molten in the pots 11, via the upper cull sections 6a and the upper runner gates 6b.

Figure 4B:
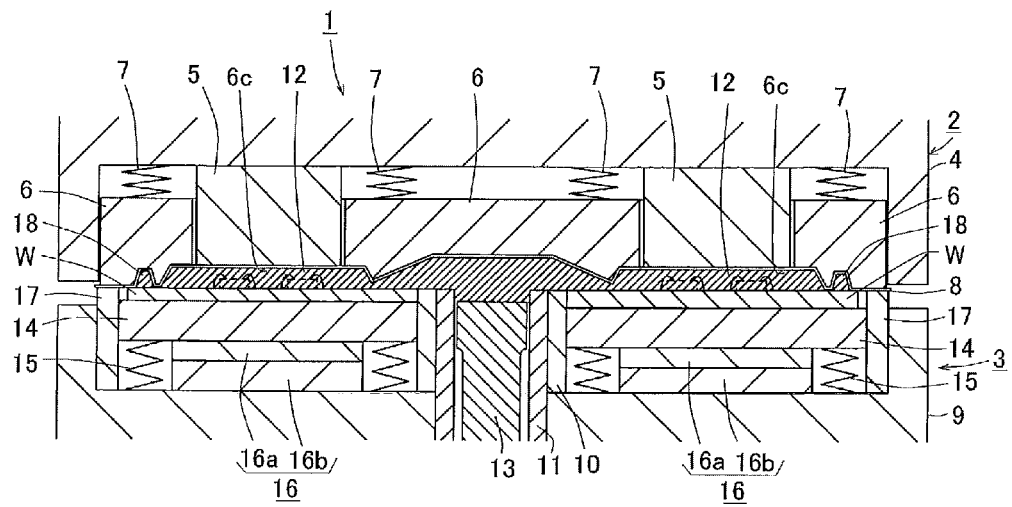

As shown in FIG. 4B, the lower molding die 3 is further moved upward after filling the cavities, and then the clamper supporting sections 17 and the works W make the movable clamper 6 compress the first springs 7. With this action, the surplus resin in the cavity-concave sections 6c is returned toward the pots 11 via the gates so as to vary the relative positions of the cavity pieces 5 with respect to the movable clamper 6 until reaching the molding positions. The surplus resin returned toward the pots 11, except a part thereof, is stored in the pots 11 by moving the plungers 13 downward. On the other hand, the rest part of the surplus resin flows into the overflow cavities 18 and stored therein. Note that, depths of the gates between the cavities and the overflow cavities 18 are made relatively shallow, so that the molten resin 12 can be flown to fill the cavity-concave sections 6c, without flowing toward the overflow cavities 18, only when the resin pressure for pushing out the surplus resin from the cavity-concave sections 6c is high.

With this action, the surplus resin is stored in the overflow cavities 18, which are formed in the clamping face of the movable clamper 6 having air vents, so that amount of the surplus resin flowing toward the pots 11 can be reduced and culls of the molded products can be thin. Therefore, the time for curing the resin in the upper cull sections 6a can be shortened, and the total time for curing the molded products can be shortened. Further, the amount of the surplus resin flowing toward the pots 11 can be reduced, so that the culls of the molded products can be easily removed from the upper molding die 2.

Embodiment 3

Next, Embodiment 3 of the molding die set will be explained. The structural elements described in the above described embodiments are assigned the same symbols and explanation will be omitted. Thus, unique features of the present embodiment will be mainly explained.

Figure 5A:
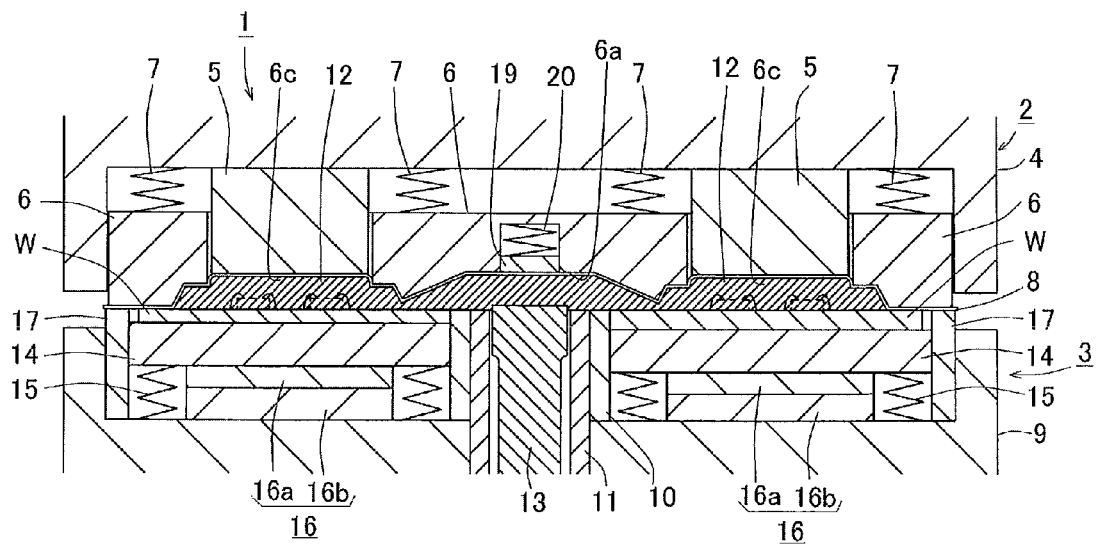
FIGS. 5A and 5B are sectional views of a molding die set of Embodiment 3, which show a molding action.

As shown in FIG. 5A, a movable piston 19 is provided in each of the upper cull sections 6a facing the pots 11. Each of the movable pistons 19 is moved by a third spring 20, which is provided between the movable piston 19 and the movable clamper 6. Spring force of the third spring 20 is at least greater than resin pressure applied by the upward movement of the plunger 13. Further, as described later, each of the movable pistons 19 is moved away from the clamping face, against the spring force of the third spring 20, by resin pressure of the surplus resin, so that a space is formed in each of the upper cull sections 6a and the surplus resin can be stored in the space. Note that, the work clamping actions, shown in FIGS. 1A-2A, are also performed in the present embodiment, so explanation will be omitted.

As shown in FIG. 5A, the plungers 13 are moved upward, in a state where the movable clamper 6 clamps the works W, so as to fill the cavity-concave sections 6c with the molten resin, which has been molten in the pots 11, via the upper cull sections 6a and the upper runner gates 6b.

Figure 5B:
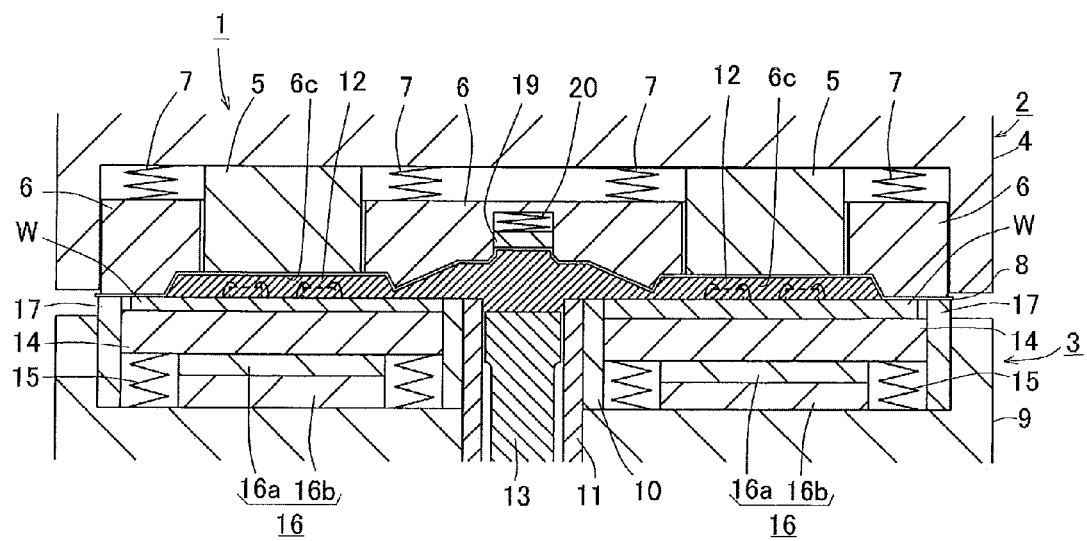

After filling the resin, as shown in FIG. 5B, the lower molding die 3 is moved upward to advance the clamping action, and the clamper supporting sections 17 and the works W make the movable clamper 6 compress the first springs 7, so that the surplus resin in the cavity-concave sections 6c is pressurized and returned toward the pots 11, via the gates, so as to vary the relative positions of the cavity pieces 5 with respect to the movable clamper 6 until reaching the molding positions, which correspond to the designed thickness of the molded products. When the surplus resin is returned toward the pots 11, the movable pistons 19 are moved away from the clamping face, against the spring force of the third springs 20, so that the surplus resin can flow into the spaces. The surplus resin returned toward the pots 11 is stored therein by moving the plungers 13 downward.

Since the surplus resin returned toward the pots 11 can be stored in the spaces by moving the movable pistons 19 from the clamping face, so that amount of the surplus resin stored in the pots 11 can be reduced and the culls of the molded products can be easily removed from the upper molding die 2.

Embodiment 4

Next, Embodiment 4 of the molding die set will be explained. The structural elements described in the above described embodiments are assigned the same symbols and explanation will be omitted. Thus, unique features of the present embodiment will be mainly explained.

Figure 6:
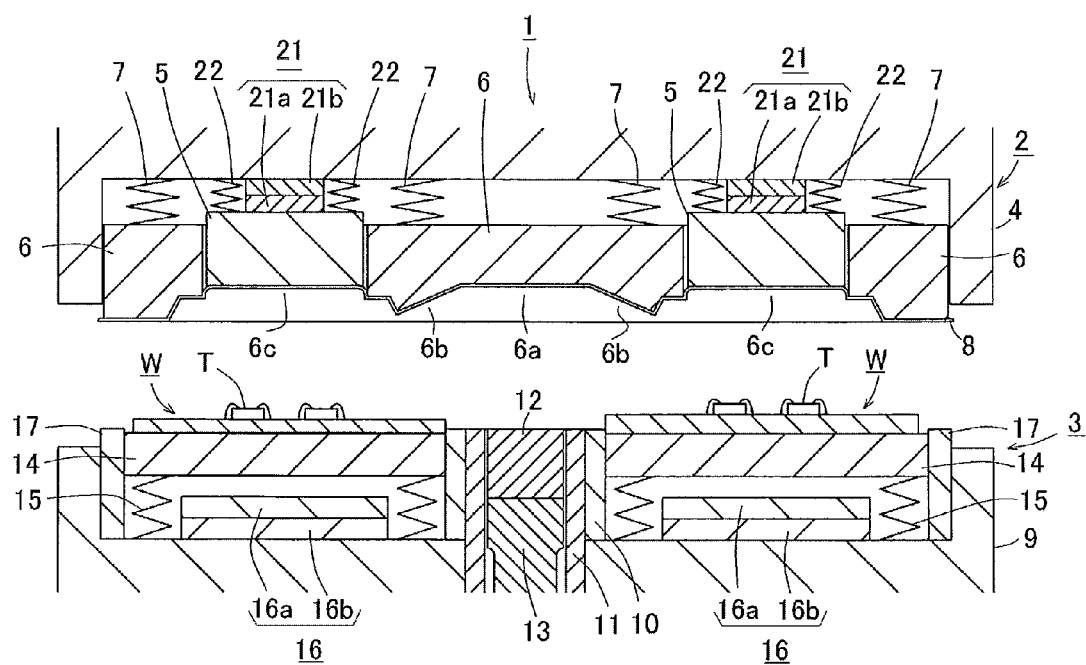
FIG. 6 is a sectional view of a molding die set of Embodiment 4, which show a molding action.

As shown in FIG. 6, cavity piece adjusting mechanisms 21, which are similar to the wedge mechanisms 16 shown in FIG. 1A, etc., are provided in the upper molding die 2 so as to adjust the heights of the cavity pieces 5. The cavity pieces 5 are suspended, from the upper chase block 4, by springs 22. The cavity piece adjusting mechanisms (wedge mechanisms) 21 are provided between the upper chase block 4 and the cavity pieces 5. By adjusting sliding positions of wedge-shaped blocks 21a and 21b, the heights of the cavity pieces 5 can be adjusted, so that the thickness of resin-molding can be adjusted. Preferably, the adjustment by the cavity piece adjusting mechanisms 21 is performed before sucking and holding the release film 8 on the clamping face of the upper molding die 2 so as to prevent the release film 8 from being slackened. Note that, the molding action including the work feeding action is the same as that of Embodiment 1, so explanation will be omitted.

In the present embodiment, the thickness of the resin-molding can be adjusted by vertically moving the cavity pieces 5. Since the wedge-shaped blocks 21a and 21b are fixed at the prescribed sliding positions, the heights of the cavity pieces 5 can be rigidly fixed, so that accuracies of heights of the cavity pieces 5 can be maintained and the thickness of the resin-molding can be precisely controlled.

Embodiment 5

Next, Embodiment 5 of the molding die set will be explained. The structural elements described in the above described embodiments are assigned the same symbols and explanation will be omitted. Thus, unique features of the present embodiment will be mainly explained.

Figure 7A:
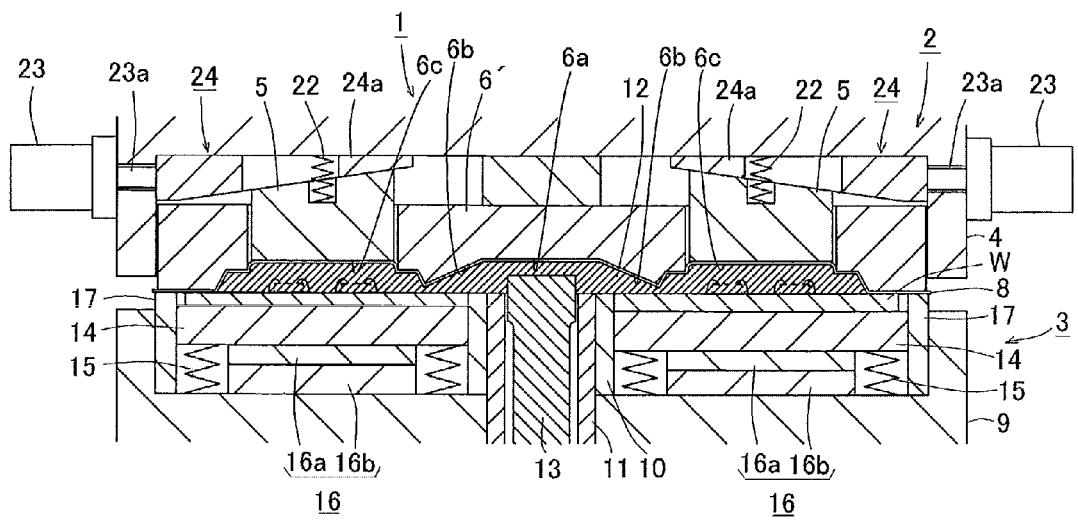
FIGS. 7A and 7B are sectional views of the molding die set of Embodiment 5, which show a molding action.

As shown in FIG. 7A, wedge mechanisms 24, which are respectively driven by electric motors (driving sources) 23 to adjust the heights of the cavity pieces 5, are provided in the upper molding die 2. Clamper 6' is fixed to the upper chase block 4, and the cavity pieces 5 are movable. These points are unique.

Concretely, the electric motors 23 are respectively attached to side faces of the upper chase block 4, and screw shafts (motor shafts) 23a are respectively screwed with wedge-shaped blocks 24a. The wedge-shaped blocks 24a are capable of sliding on a bottom face of the upper chase block 4, and their slant faces respectively contact the cavity pieces 5. By driving the electric motors 23 in a prescribed rotational direction, the wedge-shaped blocks 24a are slid in prescribed directions, so that the heights of the cavity pieces 5 can be controlled.

Note that, the slant faces may be slanted right up and/or left up. The cavity pieces 5 are suspended, from the upper chase block 4, by the springs 22. The work clamping actions, shown in FIGS. 1A-2A, are also performed in the present embodiment, so explanation will be omitted.

Next, as shown in FIG. 7A, the plunger 13 is moved upward, in a state where the clamper 6' clamps the works W, so as to fill the cavity-concave sections 6c with the molten resin 12, which has been molten in the pots 11, via the upper cull sections 6a and the upper runner gates 6b. When the cavity-concave sections 6c are filled with the resin 12, the cavity pieces 5 have been moved upward and located at the evacuating positions. Therefore, large spaces are formed above the semiconductor chips T mounted on the works W, so that a flowing speed of the molten resin is reduced and the resin 12 can fill the cavity-concave sections 6c at a lower speed and at a lower pressure.

Figure 7B:
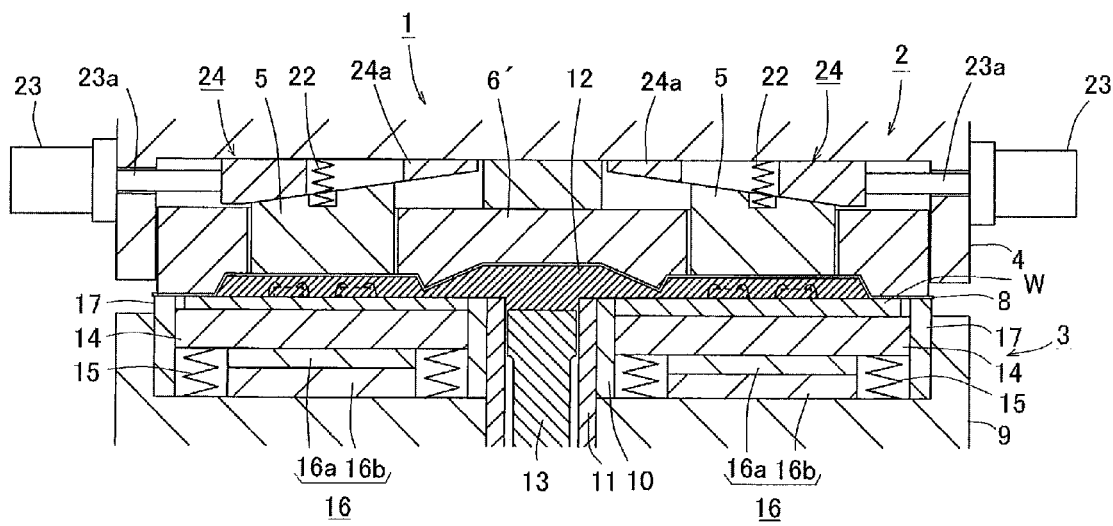

After filling the cavity-concave sections 6c with the resin 12, as shown in FIG. 7B, the electric motors 23 are driven, in a state where the clamper supporting sections 17 and the works W contact the clamper 6', so as to slide the wedge-shaped blocks 24a to move the cavity pieces 5 downward until reaching the molding positions corresponding to the designed thickness of the molded products, so that the surplus resin is pressurized and returned from the cavity-concave sections 6c toward the pots 11 via the gates. While performing this action, the work supporting sections 14 respectively contact the upper thickness adjusting blocks 16a of the wedge mechanisms 16, so the work supporting sections 14 are not moved downward even if the resin pressure is increased. Since the cavity pieces 5 respectively contact the wedge-shaped blocks 24a of the wedge mechanisms 24, the cavity pieces 5 are not moved upward. The surplus resin returned toward the pots 11 is stored by moving the plungers 13 downward.

In the present embodiment too, functions and effects of the foregoing embodiments can be obtained. Further, the cavity pieces 5 are supported and moved upward and downward by the wedge mechanisms 24, so that the cavity pieces 5 can be easily moved upward and downward and the thickness of the resin-molding can be precisely controlled.

Embodiment 6

Next, Embodiment 6 of the molding die set will be explained with reference to FIGS. 8A-8C. The structural elements described in the above described embodiments are assigned the same symbols and explanation will be omitted.

In the molding die set 1, in which the cavity piece 5 constituting the cavity-concave section 6c or the clamper 6 is movable, there is a possibility that the release film 8 is excessively extended at a corner of the cavity-concave section 6c and broken when the release film 8 is sucked and held on the clamping face. This problem can be solved in the molding die set 1 of the present embodiment.

Figure 8A:
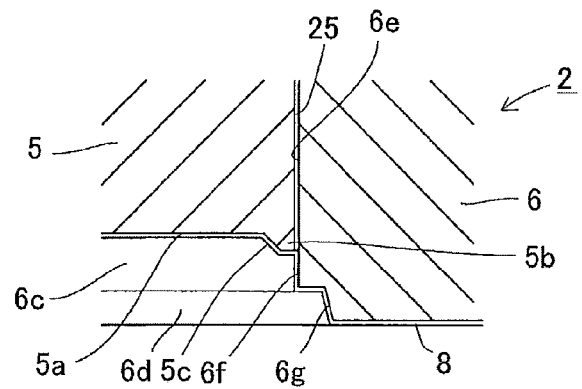
FIGS. 8A-8C are sectional views of a molding die set of Embodiment 6, which show a molding action.

In FIG. 8A, the cavity-concave section 6c is constituted by a bottom face 5a of the cavity piece 5 and a space, whose inner side face is constituted by a wall face 6f, which is a part of an inner face of a through-hole 6e formed between the bottom face 5a of the cavity piece 5 and a large hole 6d of the movable clamper 6, and an inner face 6g of the large diameter hole 6d. A sucking hole 25 is formed between the inner face of the through-hole 6e and an outer face of the cavity piece 5. The sucking hole 25 is in communication with the cavity-concave section 6c, and the release film 8, which has been fed along the inner face of the cavity-concave section 6c, is sucked and held on the inner face of the cavity-concave section 6c by sucking air in the cavity-concave section 6c, by a known sucking unit (not shown), through the sucking hole 25.

A projecting section 5b is downwardly projected along outer edges of the bottom face 5a of the cavity piece 5 so as to make the cavity-concave section 6c partially shallow. Preferably, a bottom face of the projecting section 5b is flat. Preferably, an inner face 5c of the projecting section 5b, which connects the bottom face 5a to the bottom face of projecting section 5b, is a slant face, whose angle with respect to the horizontal plane is an obtuse angle, e.g., about 135 degrees. By forming the slant face of the obtuse angle, tearing the release film 8 around the slant face can be prevented. Note that, the projecting section 5b is located outside of a mounting area of the semiconductor chip T and outside of a package area of the semiconductor chip T located on the outer side.

Figure 8B:
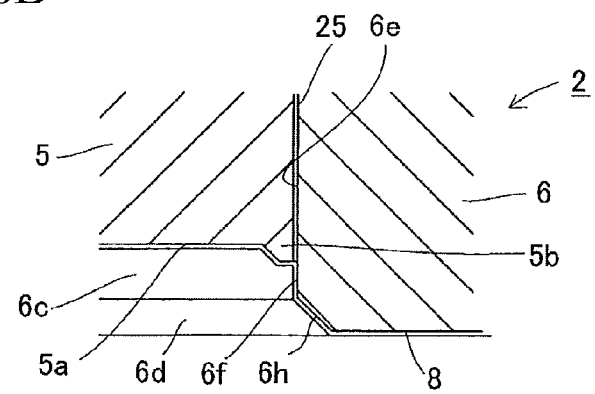

Preferably, an inner face 6h of the large diameter hole 6d is a slant face extended from a lower end of the wall face 6f as shown in FIG. 8B. An angle of the slant face 6h with respect to a parting face of the upper molding die 2 (horizontal plane) is, preferably, about 60-70 degrees.

As described above, the projecting section 5b is formed along the outer edges of the bottom face 5a of the cavity piece 5 so as to make the cavity-concave section 6c shallow. With this structure, as shown in FIG. 8A or 8B, tearing the release film 8 sucked on the cavity-concave section 6c can be highly prevented.

Figure 8C:
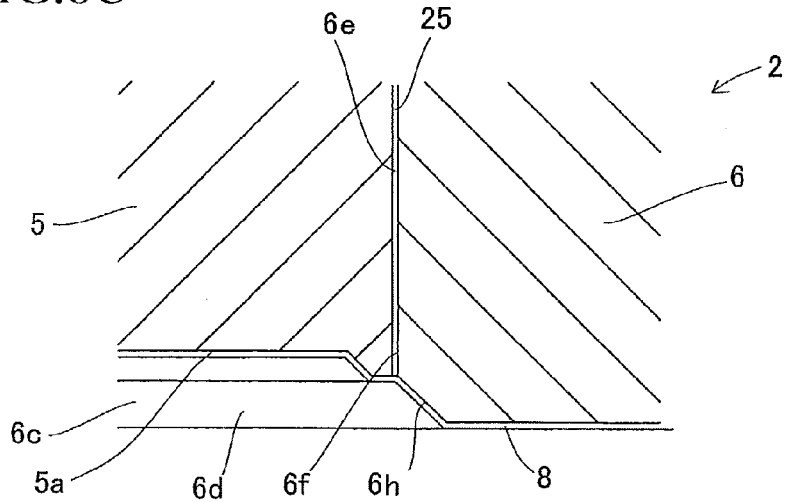

A height of the projecting section 5b from the clamping face of the molding die is designed that the bottom face of the projecting section 5b corresponds to the lower end of the through-hole 6e (an upper end of the large diameter hole 6d), as shown in FIG. 8C, when the cavity piece 5 is moved until the relative position of the cavity piece 5, with respect to the clamping face of the clamper 6, reaches a prescribed shallow position so as to drain the surplus resin toward the pot. For example, the height is about 0.5 mm. Further, a height of the projecting section 5b from the bottom face 5a of the cavity piece 5 is, for example, about 0.05-0.25 mm.

In each of the above described embodiments, the cavities are formed in the upper molding die, and the pots are formed in the lower molding die. However, the cavities may be formed in the lower molding die, and the pots may be formed in the upper molding die.

In each of the above described embodiments, the upper molding die 2 is the fixed die, and the lower molding die 3 is the movable die. The present invention is not limited to the above described embodiments. For example, the lower molding die may be a fixed die, and the upper molding die 2 may be a movable die.

The semiconductor chips T are mounted on the works W. The works W are not limited to substrates of semiconductor devices. For example, the present invention can be applied to, for example, works on which light emitting elements, e.g., white LED, are mounted and which will be molded with resin including fluorescent substances.

In the above described embodiments, the works W are the substrates on which the semiconductor chips T are wire-bonded. The semiconductor chips T may be flip-chip-bonded. The cylindrical resin tablets 12 are used to mold the works W. Further, other types of resin, e.g., liquid resin, granular resin, powder resin, may be used. The molding die set of each of the embodiments performs the map-type molding, but the molding die set may be applied to perform matrix-type molding.

The pots 11 are formed in the lower die center insert 10, but they may be formed in the upper molding die 2. Further, the molding die set may be turned upside down.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention has been described in detail, it should be understood that the various changes, substitutions, and alternations could be made hereto without departing from the spirit and scope of the invention.

What is claimed is:

1. A molding die set, comprising:
   a first molding die having a first molding chase, a cavity piece, which is supported by the first molding chase and which constitutes a bottom part of a cavity, and a movable clamper, which is movably supported by the first molding chase and which encloses the cavity piece so as to form a cavity-concave section;
   a second molding die having a second molding chase, a work supporting section, which is supported by the second molding chase and biased and on which a work will be mounted, and a center insert, which is located adjacent to the work supporting section; and
   a pot being provided to one of the first molding die and the second molding die, the pot feeding resin for molding the work,
   wherein the second molding die further has a thickness adjusting mechanism, which makes the work supporting section absorb thickness variation of the work and brings the work into contact with the movable damper when the work supported by the work supporting section is clamped with the movable damper of the first molding die, and
   the movable clamper is held by a first elastic member having an elastic power greater than an elastic power of a second elastic member of the thickness adjusting mechanism which biases the work supporting section.

2. The molding die set according to claim 1,
   wherein the cavity piece is fixed to the first molding chase, and
   the movable clamper enclosing the cavity piece is held by the first elastic member.

3. The molding die set according to claim 1,
   wherein a wedge mechanism, which supports and fixes the work supporting section at a prescribed height, is provided between the work supporting section and the second molding chase.

4. The molding die set according to claim 1,
   wherein the cavity-concave section and the thickness adjusting mechanism are provided on each side of the center insert.

5. The molding die set according to claim 1,
   wherein a cavity piece adjusting mechanism, which adjusts a height of the cavity piece, is provided to the first molding die.

6. The molding die set according to claim 1,
   wherein a clamper is fixed to the first molding chase of the first molding die, and
   a wedge mechanism, in which a wedge block is moved and brought into contact with the cavity piece, by a driving source, so as to adjust a height of the cavity piece, is provided to the first molding die.

7. The molding die set according to claim 1,
   wherein a release film is provided on a die face of the first molding die, which includes the cavity-concave section.

8. The molding die set according to claim 1,
   wherein the movable clamper clamps the work and relatively separates the cavity piece from a clamping face of the movable clamper until a relative position of the cavity piece, with respect to the clamping face, reaches an evacuating position, at which the cavity piece is separated a prescribed distance, which is greater than a designed thickness of a molded product, from the clamping face,
   the molten resin in the pot is pressurized and fed to the cavity so as to fill the cavity, and
   the clamping action is further performed to relatively move the cavity piece, toward the clamping face of the movable clamper, until reaching a prescribed shallow position so as to drain surplus resin toward the pot and thermally cure the same.

9. The molding die set according to claim 1,
   wherein a movable piston is provided in a cull section, which faces the pot, and capable of moving close to and away from a clamping face,
   the movable clamper clamps the work and relatively separates the cavity piece from the clamping face of the movable clamper until a relative position of the cavity piece, with respect to the clamping face, reaches an evacuating position, at which the cavity piece is separated a prescribed distance, which is greater than a designed thickness of a molded product, from the clamping face,
   the molten resin in the pot is pressurized and fed to the cavity so as to fill the cavity,
   the clamping action is further performed to relatively move the cavity piece, toward the clamping face of the movable clamper, until reaching a prescribed shallow position so as to drain surplus resin toward the pot; and
   the movable piston is moved away from the clamping face so as to store surplus resin.

10. The molding die set according to claim 1,
    wherein an overflow cavity is formed in a clamping face of the movable clamper, the movable clamper clamps the work and relatively separates the cavity piece from the clamping face of the movable clamper until a relative position of the cavity piece, with respect to the clamping face, reaches an evacuating position, at which the cavity piece is separated a prescribed distance, which is greater than a designed thickness of a molded product, from the clamping face, the molten resin in the pot is pressurized and fed to the cavity so as to fill the cavity, the clamping action is further performed to relatively move the cavity piece, toward the clamping face of the movable clamper, until reaching a prescribed shallow position, and surplus resin overflowed from the cavity-concave section is stored in the overflow cavity.

11. A resin molding apparatus having the molding die set according to any one of claim 1, 2 or 3-10.

* * * * *